(12) United States Patent
Ouyang et al.

(10) Patent No.: US 9,105,477 B2
(45) Date of Patent: *Aug. 11, 2015

(54) ESD PROTECTION STRUCTURE AND ESD PROTECTION CIRCUIT

(71) Applicant: Semiconductor Manufacturing International (Shanghai) Corporation, Shanghai (CN)

(72) Inventors: Paul Ouyang, Shanghai (CN); Wenjun Weng, Shanghai (CN); Huijuan Cheng, Shanghai (CN); Jie Chen, Shanghai (CN); Hongwei Li, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/227,500

(22) Filed: Mar. 27, 2014

(65) Prior Publication Data

US 2014/0291765 A1    Oct. 2, 2014

(30) Foreign Application Priority Data

Mar. 28, 2013  (CN) .......................... 2013 1 0105961
Mar. 28, 2013  (CN) .......................... 2013 1 0106740

(51) Int. Cl.
*H01L 27/02*      (2006.01)

(52) U.S. Cl.
CPC ................................. *H01L 27/0277* (2013.01)

(58) Field of Classification Search
CPC .................................................. H01L 27/0277
USPC ......................................................... 257/355
See application file for complete search history.

(56) References Cited

U.S. PATENT DOCUMENTS

| | | | |
|---|---|---|---|
| 8,779,516 B2 * | 7/2014 | Kawachi | 257/355 |
| 2006/0033163 A1 * | 2/2006 | Chen | 257/355 |
| 2009/0231766 A1 * | 9/2009 | Chang et al. | 361/56 |
| 2012/0038003 A1 * | 2/2012 | Kawachi | 257/371 |
| 2012/0044732 A1 * | 2/2012 | Li et al. | 363/147 |
| 2012/0326235 A1 * | 12/2012 | Otsuru et al. | 257/355 |
| 2013/0277745 A1 * | 10/2013 | Tsai et al. | 257/355 |
| 2014/0291764 A1 * | 10/2014 | Ouyang et al. | 257/355 |

* cited by examiner

*Primary Examiner* — William Coleman
(74) *Attorney, Agent, or Firm* — Anova Law Group, PLLC

(57) ABSTRACT

An electrostatic discharge (ESD) protection structure and an ESD protection circuit are provided. A PMOS transistor is located in a first region of a first N-type well region of a semiconductor substrate. A first doped base region located in a second region of a first N-type well region is N-type doped and connected to an external trigger-voltage adjustment circuit. An NMOS transistor is located in a third region of a first P-type well region. A second doped base region located in the fourth region of the first P-type well region is P-type doped and connected to the external trigger-voltage adjustment circuit. The external trigger-voltage adjustment circuit can be configured to pull up an electric potential of the second doped base region when the power supply terminal generates an instantaneous electric potential difference.

18 Claims, 3 Drawing Sheets

ESD PROTECTION STRUCTURE AND ESD PROTECTION CIRCUIT

CROSS-REFERENCES TO RELATED APPLICATIONS

This application claims the priority to Chinese Patent Application No. 201310105961.4, filed on Mar. 28, 2013, and Chinese Patent Application No. 201310106740.9, filed on Mar. 28, 2013, all of which are incorporated herein by reference in their entirety.

FIELD OF THE DISCLOSURE

The present disclosure generally relates to the field of electrostatic discharge (ESD) technology and, more particularly, relates to ESD protection structures and ESD protection circuits.

BACKGROUND

In fabrication and application of integrated circuit (IC) chips, along with continuous improvement in very large scale integration technologies, current CMOS IC fabrication technology has entered a deep sub-micron stage. Dimensions of MOS devices continue to shrink, thicknesses of gate oxide layers become thinner and thinner, and voltage resistance capability of the MOS devices have significantly decreased. Thus, damage to the ICs due to electrostatic discharge (ESD) has become increasingly significant. Therefore, ESD protection for ICs has become particularly important.

To increase the capability of ESD protection, an ESD protection circuit is often connected to an input/output (I/O) interface terminal (e.g., an I/O pad). The ESD protection circuit is an internal circuit in a chip for providing an electrostatic current discharge path in order to avoid electrostatic breakdown of an internal circuit.

Parts that are commonly used in a conventional ESD protection circuit include an NMOS transistor with a grounded gate, a PMOS transistor with a gate connected to a power supply, a silicon controlled rectifier (SCR), and the like. The NMOS transistor with a grounded gate has good compatibility with CMOS industry. Therefore, the NMOS transistor with a grounded gate has been widely used.

FIG. 1 illustrates a schematic structural diagram of a conventional ESD protection circuit. A drain of an NMOS transistor 13 is connected to an input/output (I/O) interface terminal 15. A gate and a source of the NMOS transistor 13 are connected to a ground terminal 16. When a large electrostatic voltage or electrostatic current is generated in the I/O interface terminal 15, static electricity is discharged to the ground terminal 16 via a parasitic NPN transistor in the NMOS transistor 13.

Details are illustrated in FIG. 2, which illustrates a cross-sectional schematic structural diagram of the NMOS transistor in FIG. 1, which includes a semiconductor substrate 100. A P-well 101 is provided in the semiconductor substrate 100. A gate 103 of the NMOS transistor is provided on the semiconductor substrate 100. A drain region 102 and a source region 104 of the NMOS transistor are respectively provided in the P-well 101 on two sides of the gate 103. The drain region 102 of the NMOS transistor is connected to the I/O interface terminal 15. The source region 104 and the gate 103 of the NMOS transistor are connected to the ground terminal 16.

A P-type doped region or a P-region 105 is further provided in the P-well 101 on a source region 104 side. The P-region 105 is connected to the ground terminal 16. A shallow trench isolation structure 106 is provided between the P-region 105 and the source region 104. The drain region 102 of the NMOS transistor configures a collector region of a parasitic NPN transistor 17. The source region 104 of the NMOS transistor configures an emitter region of the parasitic NPN transistor 17. The P-well 101 at bottom of the gate 103 configures a base region of the parasitic NPN transistor 17.

When electrostatic charge accumulates on the I/O interface terminal 15, current flows from the drain region 102 via a well region resistance 18 to the P-region 105 and thereby generates an electric potential difference between the P-well 101 at the bottom of the gate 103 and the ground terminal 16. When the electric potential difference becomes greater than a threshold voltage of the parasitic NPN transistor 17, the parasitic NPN transistor 17 is in a conductive state. In this case, current flows from the drain region 102 to the source region 104 to discharge the electrostatic charge accumulated on the I/O interface terminal 15.

The conventional ESD protection circuit thus has low electrostatic discharge efficiency when performing electrostatic discharge.

BRIEF SUMMARY OF THE DISCLOSURE

One aspect of the present disclosure includes an electrostatic discharge (ESD) protection structure. The ESD protection structure can include a semiconductor substrate, a PMOS transistor, a first doped base region, an NMOS transistor, and a second doped base region. The semiconductor substrate can include a first N-type well region and a first P-type well region, the first N-type well region including a first region and a second region, and the first P-type well region including a third region and a fourth region. The PMOS transistor can be located in the first region of the first N-type well region, the PMOS transistor including a gate located on the first N-type well region, and a source region and a drain region respectively located on both sides of the gate in the first N-type well region, the source region and the gate of the PMOS transistor being connected to a power supply terminal, and the drain region of the PMOS transistor being connected to an input and output (I/O) interface terminal. The first doped base region located in the second region of the first N-type well region can be N-type doped and connected to an external trigger-voltage adjustment circuit. The external trigger-voltage adjustment circuit can be configured to pull down an electric potential of the first doped base region when the power supply terminal generates an instantaneous electric potential difference. The NMOS transistor located in the third region of the first P-type well region can include a gate located on the first P-type well region, and a source region and a drain region respectively located on both sides of the gate in the first P-type well region, the drain region of the NMOS transistor being connected to the I/O interface terminal, and the gate and the source region of the NMOS transistor being connected to a ground terminal. The second doped base region located in the fourth region of the first P-type well region can be P-type doped and connected to the external trigger-voltage adjustment circuit. The external trigger-voltage adjustment circuit can be configured to pull up an electric potential of the second doped base region when the power supply terminal generates the instantaneous electric potential difference.

Another aspect of the present disclosure includes an electrostatic discharge (ESD) protection circuit. The ESD protection circuit can include a PMOS transistor, an NMOS transistor, a first PNP-type parasitic transistor, a second PNP-type parasitic transistor, and a first NPN-type parasitic transistor.

The PMOS transistor can have a source region and a gate connected to a power supply terminal, and a drain region connected to an I/O interface terminal. The NMOS transistor can have a drain region connected to the I/O interface terminal, and a gate and a source region connected to a ground terminal. The first PNP-type parasitic transistor can have an emitter region connected to the power supply terminal, a collector region connected to the ground terminal, and a base region connected to an external trigger-voltage adjustment circuit. The external trigger-voltage adjustment circuit can be configured to pull down an electric potential of the base region of the first PNP-type parasitic transistor when the power supply terminal generates an instantaneous electric potential difference. The second PNP-type parasitic transistor can have an emitter region connected to the I/O interface terminal, a collector region connected to the ground terminal, and a base region connected to the external trigger-voltage adjustment circuit. The external trigger-voltage adjustment circuit can be configured to pull down an electric potential of the base region of the second PNP-type parasitic transistor when the power supply terminal generates an instantaneous electric potential difference. The first NPN-type parasitic transistor can have an emitter region connected to the ground terminal, a collector region connected to the I/O interface terminal, and a base region connected to the external trigger-voltage adjustment circuit. The external trigger-voltage adjustment circuit can be configured to pull up an electric potential of the base region of the first NPN-type parasitic transistor when the power supply terminal generates an instantaneous electric potential difference.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
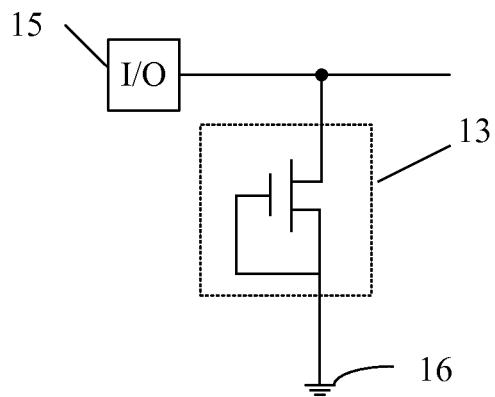
FIGS. 1-2 illustrate a schematic structural diagram of a conventional ESD protection circuit.
Figure 2:
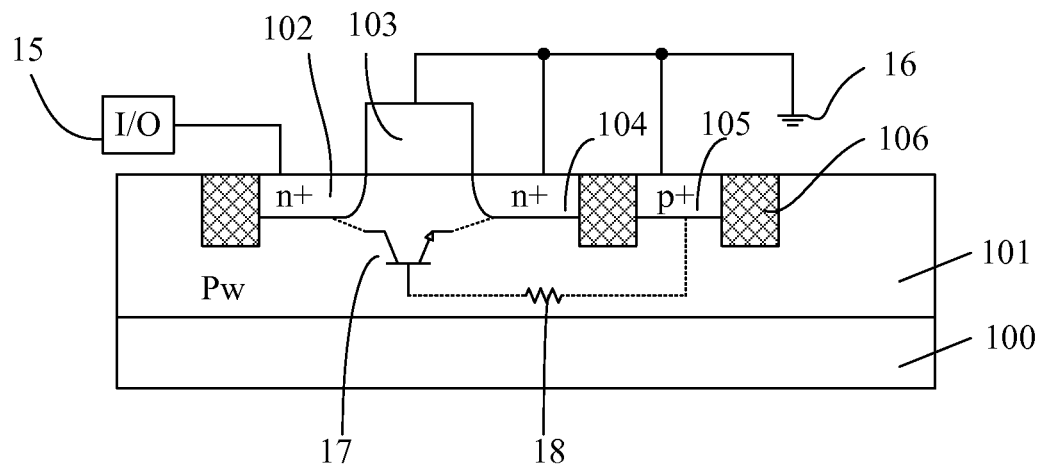

Referring back to in FIG. 2, conventional ESD protection circuit performs electrostatic discharge via the parasitic NPN transistor 17 and has only one path for electrostatic discharge, and the electrostatic discharge via the parasitic NPN transistor is passively triggered. That is, when a certain amount of electrostatic charge is accumulated on the I/O interface terminal 15, current flows from the drain region 102 via the well region resistance 18 to the P-region 105 and thereby generates an electric potential difference between the P-well region at the bottom of the gate 103 and the ground terminal 16. When the electric potential difference becomes greater than a threshold voltage of the parasitic NPN transistor 17, the electrostatic charge accumulated on the I/O interface terminal 15 is discharged. Therefore, the electrostatic discharge efficiency of the conventional ESD protection circuit is relatively low.

As disclosed, an exemplary ESD protection structure is provided. For example, a PMOS transistor can be provided in a first region of a first N-type well region. A first doped base region can be provided in a second region of the first N-type well region. The first doped base region can have a doping type of N-type. A source region and a gate of the PMOS transistor can be connected to a power supply terminal. A drain region of the PMOS transistor can be connected to an I/O interface terminal. The first doped base region can be connected to an output terminal of an external trigger-voltage adjustment circuit. An NMOS transistor can be provided in a third region of a first P-type well region. A second doped base region can be located in the fourth region of the first P-type well region. The second doped base region can be P-type doped. A drain region of the NMOS transistor can be connected to the I/O interface terminal. A gate and a source region of the NMOS transistor can be connected to the ground terminal. The second doped base region can be connected to the external trigger-voltage adjustment circuit.

In the exemplary ESD protection structure, the first doped base region, the source region of the PMOS transistor and the semiconductor substrate can form a first PNP-type parasitic transistor. The first doped base region, the drain region of the PMOS transistor and the semiconductor substrate can form a second PNP-type parasitic transistor. The second doped base region, the drain region of the NMOS transistor, and the source region of the NMOS transistor can form a first NPN-type parasitic transistor.

Therefore, when electrostatic charge is accumulated on the I/O interface terminal and/or the power supply terminal, the electrostatic charge can be discharged to the ground terminal via electrostatic discharge paths configured by the first PNP-type parasitic transistor, the second PNP-type parasitic transistor, and/or the first NPN-type parasitic transistor. Therefore, the number of the electrostatic discharge paths can be increased and the electrostatic discharge efficiency can be improved.

Further, the second doped base region and the first doped base region can be respectively connected to the external trigger-voltage adjustment circuit. This can allow electric potentials of the base regions of the first PNP-type parasitic transistor, the second PNP-type parasitic transistor and the first NPN-type parasitic transistor to be controlled via the external trigger-voltage adjustment circuit so that conduction in the first PNP-type parasitic transistors and the second PNP-type parasitic transistors can be circuit-controlled instead of being passively triggered. Therefore, the ability to control the parasitic transistors can be strengthened and that accumulated electrostatic charge cannot be timely and effectively discharged can be prevented.

Figure 3:
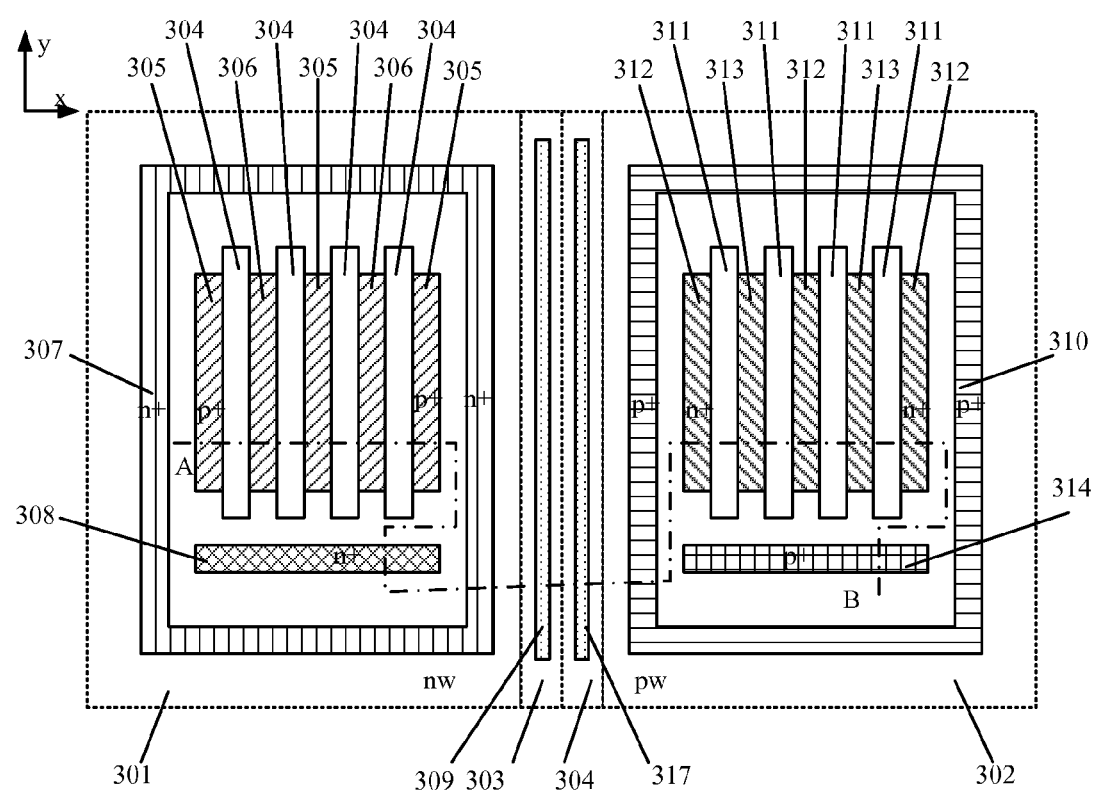
FIGS. 3-4 are schematics illustrating an exemplary ESD protection structure in accordance with various disclosed embodiments.
Figure 4:
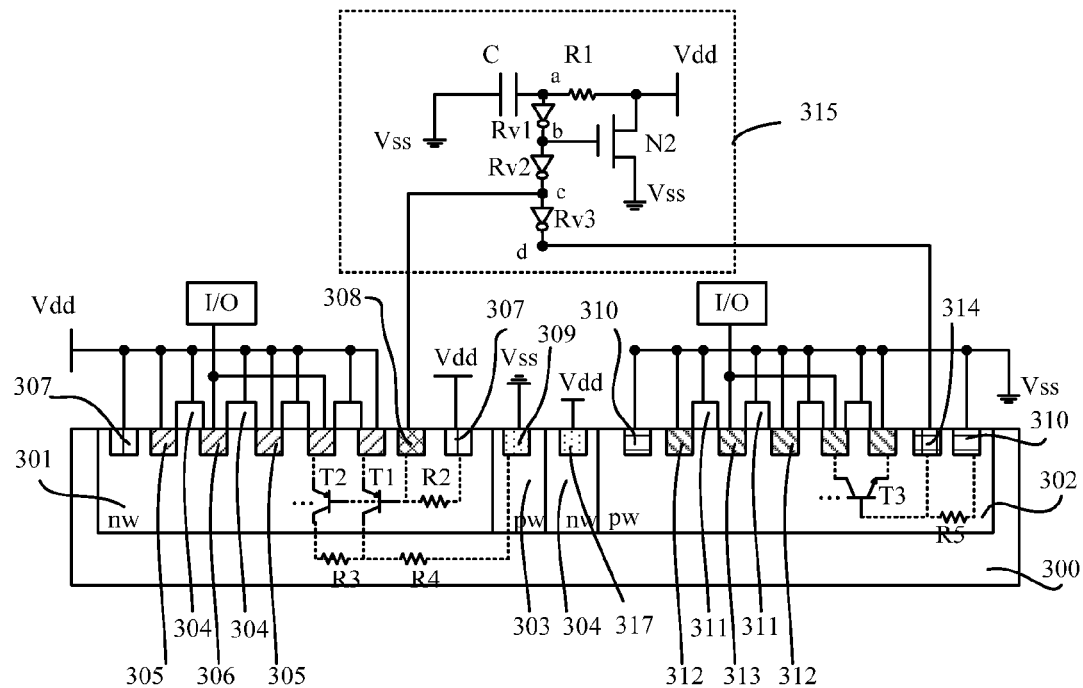
Figure 5:
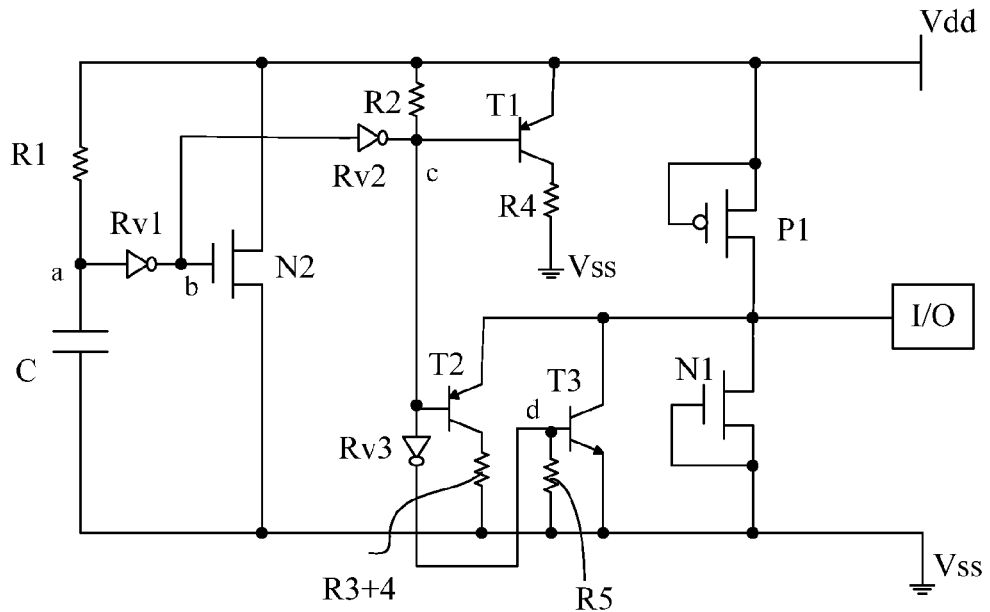
FIG. 5 is a schematic illustrating an exemplary ESD protection circuit in accordance with various disclosed embodiments.

In FIGS. 3-5, FIG. 3 illustrates a top view of an exemplary ESD protection structure according to an embodiment of the present disclosure (note that interfacing ports and external circuits are not illustrated in FIG. 3). FIG. 4 illustrates a schematic structural diagram along a direction of a cutting line AB in FIG. 3. FIG. 5 illustrates a schematic structural diagram of an exemplary ESD protection circuit according to an embodiment of the present disclosure.

As illustrated in FIGS. 3-4, the ESD protection structure can include a semiconductor substrate 300, a PMOS transistor, a first doped base region 308, and an NMOS transistor. A first N-type well region 301 and a first P-type well region 302 can be provided in the semiconductor substrate 300. The first N-type well region 301 can include a first region and a second region. The first P-type well region 302 can include a third region and a fourth region.

The PMOS transistor can be located in the first region of the first N-type well region 301 and can include a gate located on the first N-type well region 301 and a source region and a drain region respectively located on two sides of the gate in the first N-type well region 301. The source region and the gate of the PMOS transistor can be connected to a power supply terminal Vdd. The drain region of the PMOS transistor can be connected to an I/O interface terminal.

The first doped base region 308 can be located in the second region of the first N-type well region 301 and can have a doping type of N-type. The first doped base region 308 can be connected to a second output terminal, terminal c, of an external trigger-voltage adjustment circuit 315. When the power supply terminal Vdd generates an instantaneous electric potential difference, the external trigger-voltage adjustment circuit 315 can pull down an electric potential of the first doped base region 308.

The NMOS transistor can be located in the third region of the first P-type well region 302 and can include a gate 311 located on the first P-type well region 302 and a source region and a drain region respectively located on two sides of the gate 311 in the first P-type well region 302. The drain region of the NMOS transistor can be connected to the I/O interface terminal. The gate and the source region of the NMOS transistor can be connected to a ground terminal Vss.

As illustrated in FIGS. 3 and 5, the ESD protection structure further can include a second doped base region 314. The second doped base region 314 can be located in the fourth region of the first P-type well region 302 and can have a doping type of P-type. The second doped base region 314 can be connected to a third output terminal, terminal d, of the external trigger-voltage adjustment circuit 315 (e.g., as shown in FIGS. 4 and 5). When the power supply terminal Vdd generates an instantaneous electric potential difference, the external trigger-voltage adjustment circuit 315 can pull up an electric potential of the second doped base region 314.

In one embodiment, the semiconductor substrate 300 can be a P-type doped substrate. A material of the semiconductor substrate 300 may be single crystal silicon (Si), single crystal germanium (Ge), silicon germanium (GeSi) or silicon carbide (SiC), and may also be silicon-on-insulator (SOI), germanium-on-insulator (GOI), or other materials, for example, group III-V compounds such as gallium arsenide.

A second N-type well region 304 and a second P-type well region 303 that can be adjacent to each other can be provided between the first N-type well region 301 and the first P-type well region 302. The first N-type well region 301, the second P-type well region 303, the second N-type well region 304 and the first P-type well region 302 can be sequentially alternately distributed in the semiconductor substrate.

A second P-region 309 can be provided in the second P-type well region 303 (as shown in FIG. 4). The second P-region 309 can be connected to the ground terminal Vss. The second P-region 309 can be used as a regional static electricity discharge port for the PMOS transistor.

The second N-type well region 304 can include a second N-region (N-type doped region) 317 connected to the power supply terminal Vdd to reverse bias a PN junction formed by the second N-type well region 304 and the second P-type well region 303 to prevent latch-up from occurring between the PMOS transistor formed in the first N-type well region 301 and the NMOS transistor formed in the first P-type well region 302, thereby enhancing stability of the ESD protection structure.

In FIG. 3, the second P-type well region 303, the second N-type well region 304, and the first P-type well region 302 can be located to the right (as shown, along the positive direction of an x-axis) of the first N-type well region 301. In other embodiments, the second P-type well region 303, the second N-type well region 304 and the first P-type well region 302 may be located to the left (as shown, along the negative direction of the x-axis), above (along the positive direction of a y-axis) or below (along the negative direction of the y-axis) of the first N-type well region 301.

The first N-type well region 301 can include the first region and the second region. The second region can be configured adjacent to the first region. The PMOS transistor can be provided in the first region. The first doped base region 308 can be provided in the second region. The first doped base region 308 can have a doping type of N-type. Doped ions in the first doped base region 308 can be phosphorus ions, arsenic ions, or antimony ions. A technology for forming the first doped base region 308 can be compatible with a conventional technology for forming a source-drain region of the NMOS transistor so that additional lithography and implantation processes are not needed so as to reduce manufacturing costs.

A first N-region 307 can be further provided in the first N-type well region 301. The first N-region 307 can surround the PMOS transistor and the first doped base region 308 (e.g., as shown in FIG. 3). The first N-region 307 can be connected to the power supply terminal Vdd. When connected to Vdd, the first N-region 307 can have a function of isolation and preventing latch-up.

The PMOS transistor can be a single PMOS transistor or a common-source/drain PMOS transistor that is configured in a form of a plurality of PMOS transistors. In the present embodiment, as illustrated in FIGS. 3 and 4, the PMOS transistor can be a common-source/drain PMOS transistor. The common-source/drain PMOS transistors can include first source regions 305 and first drain regions 306 that can be alternately and spacedly distributed in the first region of the first N-type well region 301 and can have a doping type of P-type, and first gates 304 that can be respectively located between neighboring first source regions 305 and first drain regions 306 on the first N-type well region 301.

The first gates 304 and first source regions 305 can be connected to the power supply terminal Vdd. The first drain regions 306 can be connected to the I/O interface terminal. The first doped base region 308 and the first source regions 305 and the semiconductor substrate 300 can configure parallelly configured first PNP-type parasitic transistors T1 (e.g., as shown in FIG. 4, although only one of the first PNP-type parasitic transistors is illustrated).

The first doped base region 308 can be a base region of the first PNP-type parasitic transistor T1. The first source region 305 can be an emitter region of the first PNP-type parasitic transistor T1. The semiconductor substrate 300 can be a collector region of the first PNP-type parasitic transistor T1. The first doped base region 308 and the first drain regions 306 and the semiconductor substrate 300 can configure parallelly configured second PNP-type parasitic transistors T2 (although in FIG. 4, only one of the second PNP-type parasitic transistors is illustrated). The first doped base region 308 can be a base region of the second PNP-type parasitic transistors T2. The first drain regions 306 can be emitter regions of the second PNP-type parasitic transistors T2. The semiconductor substrate 300 can be a collector region of the second PNP-type parasitic transistors T2.

In one embodiment, the first PNP-type parasitic transistors T1 and second PNP-type parasitic transistors T2 can be formed between the first source regions 305 and first drain regions 306 of the common-source/drain PMOS transistors, the first doped base region 308 and the semiconductor substrate 300. When electrostatic charge accumulates on the power supply terminal Vdd and/or the I/O interface terminal, the electrostatic charge can be discharged to the ground terminal Vss via the first PNP-type parasitic transistors T1 and the second PNP-type parasitic transistors T2, the P-type semiconductor substrate 300, the second P-type well region 303, the second P-region 309. Therefore, the number of electrostatic discharge paths can be increased and efficiency of electrostatic discharge can be improved.

In one embodiment, the second region of the first N-type well region 301 can be located in an extension direction (e.g., along the negative direction of the y-axis) along which the first gate 304 extends toward tow ends (e.g., as shown in FIG. 3). The first doped base region 308 can be located in the second region. The first doped base region 308 can have a length in a distribution direction of the first source regions 305 and the first drain regions 306 (e.g., along the direction of the x-axis) equal to a distribution width of the first source regions 305 and the first drain regions 306. The first doped base region 308 can have a width of about 0.5 μm to about 5 μm.

Thus, not only the first doped base region 308 can have a relatively small layout area, distances between the first doped base region 308 and the first source regions 305 and first drain regions 306 can also be equal. Therefore, the first PNP-type parasitic transistors T1 and the second PNP-type parasitic transistors T2 can be formed to have similar electrical parameters (e.g., including a threshold voltage and the like). When the first doped base region 308 is connected to a second terminal, terminal c, of the external trigger-voltage adjustment circuit 315, the first doped base region 308 (which can be a base region of the first PNP-type parasitic transistors T1 and the second PNP-type parasitic transistors T2) can have the same ability to control each of the first PNP-type parasitic transistors T1 and the second PNP-type parasitic transistors T2, and thus uniformity of electrostatic discharge and stability of the ESD protection circuit can be improved.

In other embodiments, the first region and the second region can also be arranged in a different way. It should be noted that the way in which the first region and the second region are arranged does not limit the scope of the present disclosure.

The first P-type well region 302 can include the third region and the fourth region. The third region and the fourth region can be adjacent to each other. The NMOS transistor can be provided third region. The second doped base region 314 can be provided in the fourth region. The second doped base region 314 can have a doping type of P-type. Doped ions in the second doped base region 314 can be boron ions, gallium ions, and/or indium ions.

A first P-region 310 can be further provided in the first P-type well region 302. The first P-region 310 can surround the NMOS transistor and the second doped base region 314. The first P-region 310 can be connected to the ground terminal Vss. The first P-region 310 can have a function of isolation and preventing latch-up.

The NMOS transistor can be a single NMOS transistor or a common-source/drain NMOS transistor that can be configured having a plurality of NMOS transistors. In the present embodiment, the NMOS transistor can be a common-source/drain NMOS transistor. The common-source/drain NMOS transistor can include second source regions 312 and second drain regions 313 that can be alternately and spacedly distributed in the third region of the first P-type well region 302 and second gates 311 that can be respectively located between neighboring second source regions 312 and second drain regions 313 on the first P-type well region 30r2. The second source regions 312 and the second gates 311 can be connected to the ground terminal Vss. The second drain regions 313 can be connected to the I/O interface terminal.

The second doped base region 314 and the second source regions 312 and the second drain regions 313 can form a plurality of first NPN-type parasitic transistors T3. For example, the second doped base region 314 can be a base region of the first NPN-type parasitic transistors T3. The second source regions 312 can be emitter regions of the first NPN-type parasitic transistors T3. The second drain regions 313 can be collector regions of the first NPN-type parasitic transistors T3. When electrostatic charge accumulates on the I/O interface terminal, the electrostatic charge can be discharged to the ground terminal Vss via the first NPN-type parasitic transistors T3 via the first P-type well region 302 and the first P-region 310. Therefore, the number of electrostatic discharge paths can be increased and the electrostatic discharge efficiency can be improved.

As illustrated in FIG. 3, the fourth region of the first P-type well region 302 can be located in an extension direction (e.g., along the negative direction of the y-axis) along which the second gate 311 extends toward two ends. The second doped base region 314 can be provided in the fourth region. The second doped base region 314 can have a length in a distribution direction of the second source regions 312 and the second drain regions 313 (e.g., along the direction of the x-axis) equal to a distribution width of the second source regions 312 and the second drain regions 313. The second doped base region 314 can have a width of about 0.5 μm to about 5 μm.

Thus, not only the second doped base region 314 can have a relatively small layout area, distances between the second doped base region 314 and the second source regions 312 and second drain regions 313 can also be equal. Therefore, the formed plurality of first NPN-type parasitic transistors T3 can have similar electrical parameters (e.g., including a threshold voltage and the like). When the second doped base region 314 is connected to a third terminal, terminal d, of the external trigger-voltage adjustment circuit 315, the second doped base region 314 can have the same or similar ability to control each of the plurality of the first NPN-type parasitic transistors T3 (e.g., as shown in FIG. 4). The uniformity of electrostatic discharge and stability of the ESD protection circuit can thus be improved.

As illustrated in FIG. 4, the external trigger-voltage adjustment circuit 315 can include an RC (i.e., resistor-capacitor) coupling circuit and an inverter circuit. The RC coupling circuit can include a coupling capacitor C and a coupling resistor R1 that can be serially connected. Another terminal of the coupling resistor R1 can be connected to the power supply terminal Vdd. Another terminal of the coupling capacitor C can be connected to the ground terminal Vss. An RC coupling node a can be connected to the inverter circuit.

The inverter circuit can include a first inverter Rv1, a second inverter Rv2 and a third inverter Rv3 that can be serially connected. An input terminal of the first inverter Rv1 can be connected to the RC coupling node. An output terminal of the first inverter Rv1 can be connected to an input terminal of the second inverter Rv2. An output terminal of the second inverter Rv2 (or the second output terminal, terminal c) can be connected to an input terminal of the third inverter Rv3 and the first doped base region 308. An output terminal of the third inverter Rv3 (or the third output terminal, terminal d) can be connected to the second doped base regions 314 (e.g., as shown in FIG. 5).

When the power supply terminal Vdd generates an instantaneous electric potential difference (or an instantaneous pulse) due to accumulation of electrostatic charge (or when electrostatic charge accumulated on the I/O interface terminal flows via a parasitic diode configured by the first drain region 306 and the first N-region 307 to the power supply terminal Vdd so that the power supply terminal Vdd generates an instantaneous electric potential difference), the external trigger-voltage adjustment circuit 315 that can be configured by the RC coupling circuit and the inverter circuit can pull down an electric potential of the first doped base region 308 and can trigger conduction in the first PNP-type parasitic transistors T1 and the second PNP-type parasitic transistors T2 so that electrostatic charge accumulated on the power supply terminal Vdd and the I/O interface terminal can be discharged to the ground terminal via the first PNP-type parasitic transistors T1, the second PNP-type parasitic transistors T2, the P-type semiconductor substrate 300, the second P-type well region 303, and the second P-region 309.

Meanwhile, the external trigger-voltage adjustment circuit 315 can pull up an electric potential of the second doped base regions 314 and can trigger conduction in the first NPN-type parasitic transistors T3 so that electrostatic charge accumulated on the I/O interface terminal can be discharged to the ground terminal via the plurality of the first NPN-type parasitic transistors T3, the first P-type well region 302 and the first P-region 310.

Therefore, in the disclosed ESD protection structure, triggered conduction is not passively triggered after electrostatic charge has been accumulated, but is actively controlled by controlling the parasitic transistors using the external trigger-voltage adjustment circuit 315. Therefore, electrostatic discharge sensitivity of the ESD protection structure can be improved. In addition, in the embodiment of the present disclosure, the ESD protection structure can simultaneously perform electrostatic discharge via the electrostatic discharge paths configured by the first PNP-type parasitic transistors T1, the second PNP-type parasitic transistors T2, and the first NPN-type parasitic transistors T3. Therefore, the number of electrostatic discharge paths can be increased and efficiency of the electrostatic discharge can be improved.

The first inverter Rv1, the second inverter Rv2, and the third inverter Rv3 can be CMOS inverters or TTL inverters. In one embodiment, the first inverter Rv1, the second inverter Rv2, and the third inverter Rv3 are CMOS inverters.

The ESD protection structure can further include a switch-type NMOS transistor N2. A drain of the switch-type NMOS transistor N2 can be connected to the power supply terminal Vdd. A source of the switch-type NMOS transistor N2 can be connected to the ground terminal Vss. A gate of the switch-type NMOS transistor N2 can be connected to the first output terminal, terminal b, of the first inverter Rv1. The switch-type NMOS transistor N2 can add electrostatic discharge path from the power supply terminal Vdd to the ground terminal Vss.

Referring to FIG. 5, a ESD protection circuit configured by the above ESD protection structure can include: a PMOS transistor P1, a source region and a gate of the PMOS transistor P1 being connected to a power supply terminal Vdd, a drain region of the PMOS transistor P1 being connected to an I/O interface terminal; an NMOS transistor N1, a drain region of the NMOS transistor N1 being connected to the I/O interface terminal, a gate and a source region of the NMOS transistor N1 being connected to a ground terminal Vss.

A first PNP-type parasitic transistor T1 (or parallelly configured first PNP-type parasitic transistors), a base region of the first PNP-type parasitic transistor T1 being connected via a second parasitic resistor R2 to the power supply terminal Vdd, an emitter region of the first PNP-type parasitic transistor T1 being connected to the power supply terminal Vdd, and a collector region of the first PNP-type parasitic transistor T1 being connected via a fourth parasitic resistor R4 to the ground terminal Vss.

A second PNP-type parasitic transistor T2 (or parallelly configured second PNP-type parasitic transistors), an emitter region of the second PNP-type parasitic transistor T2 being connected to the I/O interface terminal, and a collector region of the second PNP-type parasitic transistor T2 being connected via a third parasitic resistor R3+4 to the ground terminal Vss.

A first NPN-type parasitic transistor T3 (or parallelly configured first NPN-type parasitic transistors), a base region of the first NPN-type parasitic transistor T3 being connected via a fifth parasitic resistor R5 to the ground terminal Vss, an emitter region of the first NPN-type parasitic transistor T3 being connected to the ground terminal Vss, and a collector region of the first NPN-type parasitic transistor T3 being connected to the I/O interface terminal.

The ESD protection circuit can further include an external trigger-voltage adjustment circuit. The external trigger-voltage adjustment circuit can include an RC coupling circuit and an inverter circuit. The RC coupling circuit can include a coupling capacitor C and a coupling resistor R1 that can be serially connected. Another terminal of the coupling resistor R1 can be connected to the power supply terminal Vdd. Another terminal of the coupling capacitor C can be connected to the ground terminal Vss. An RC coupling node a can be connected to the inverter circuit.

The inverter circuit can include a first inverter Rv1, a second inverter Rv2 and a third inverter Rv3 that can be serially connected. An input terminal of the first inverter Rv1 can be connected to the RC coupling node a. An output terminal (or a first output terminal, terminal b) of the first inverter Rv1 can be connected to an input terminal of the second inverter Rv2. An output terminal (or a second output terminal, terminal c) of the second inverter Rv2 can be connected to an input terminal of the third inverter Rv3, a base region of the first PNP-type parasitic transistor T1 and a base region of the second PNP-type parasitic transistor T2. An output terminal (or a third output terminal, terminal d) of the third inverter Rv3 can be connected to a base region of the first NPN-type parasitic transistor T3.

The ESD protection circuit can further include a switch-type NMOS transistor N2. A drain of the switch-type NMOS transistor N2 can be connected to the power supply terminal Vdd. A source of the switch-type NMOS transistor N2 can be connected to the ground terminal Vss. A gate of the switch-type NMOS transistor N2 can be connected to an output terminal of the first inverter Rv1.

An operational principle of the above-described circuit can be as follows. When the power supply terminal Vdd generates an instantaneous electric potential difference due to accumulation of electrostatic charge (or when electrostatic charge accumulated on the I/O interface terminal flows via a parasitic diode configured by the first drain region 306 and the first N-region 307 to the power supply terminal Vdd so that the power supply terminal Vdd generates an instantaneous electric potential difference), a coupling effect of the RC circuit can pull down an electric potential of a point a so that the point a can become low level. After inversion by the first inverter Rv1, a point b (or the first output terminal) can become high level so that the switch-type NMOS transistor N2 can become conductive, and the power supply terminal Vdd can discharge electrostatic charge via the switch-type NMOS transistor N2 to the ground terminal Vss.

After the high level of the point b is inverted by the second inverter Rv2, a point c (or the second output terminal) can become low level so that the first PNP-type parasitic transistor T1 and the second PNP-type parasitic transistor T2 can become conductive, and the power supply terminal Vdd can discharge electrostatic charge via the first PNP-type parasitic transistor T1 to the ground terminal Vss, and the I/O interface terminal can discharge electrostatic charge via the second PNP-type parasitic transistor T2 to the ground terminal Vss.

After the low level of the point c is inverted by the third inverter Rv2, a point d (or the third output terminal) can become high level so that the first NPN-type parasitic transistor T3 can become conductive and the I/O interface terminal can discharge electrostatic charge via the first NPN-type parasitic transistor T3 to the ground terminal Vss.

In this manner, in the disclosed ESD protection structure, the first doped base region, the source region of the PMOS transistor and the semiconductor substrate can form a first PNP-type parasitic transistor. The first doped base region, the drain region of the PMOS transistor and the semiconductor substrate can form a second PNP-type parasitic transistor. The second doped base region, the drain region of the NMOS transistor, the source region of the NMOS transistor can form a first NPN-type parasitic transistor.

Therefore, when electrostatic charge is accumulated on the I/O interface terminal and/or the power supply terminal, the electrostatic charge can be discharged to the ground terminal via electrostatic discharge paths configured by the first PNP-type parasitic transistor, the second PNP-type parasitic transistor, and/or the first NPN-type parasitic transistor. Therefore, the number of the electrostatic discharge paths can be increased and the electrostatic discharge efficiency can be improved.

In addition, the second doped base region and the first doped base region can be respectively connected to the external trigger-voltage adjustment circuit. This can allow electric potentials of the base regions of the first PNP-type parasitic transistor, the second PNP-type parasitic transistor and the first NPN-type parasitic transistor to be controlled via the external trigger-voltage adjustment circuit so that conduction in the parasitic transistors (e.g., the first PNP-type and the second PNP-type parasitic transistors) can be circuit-controlled instead of being passively triggered. Therefore, the ability to control the parasitic transistors can be improved.

In certain embodiments, a wafer-level (e.g., whole-chip) ESD protection method with RC triggered bipolar devices can be provided. Such method can be compatible with normal CMOS process without demanding extra manufacturing steps, and with latch up free ability and small layout area consuming. Manufacturing cost can be reduced and ESD robustness of the chip can be improved.

For example, each I/O cell (or I/O interface) can have a local discharge path to discharge ESD current in the ESD events, e.g., on a Vdd bus, in each I/O cell. With small layout area and high layout efficiency, large ESD discharge current can be provided to achieve high ESD performance. Because the discharge devices are bipolars (or bipolar transistors) not grounded-gate NMOS (gg NMOS, snap-back), ESD implant mask can also be removed.

An N+ diffusion area can be added within the ESD PMOS guard-ring. A P+ diffusion area can also be added within the ESD PMOS guard-ring. The added P+/N+ diffusion can form the disclosed PNP and NPN bipolar transistors, which are RC-triggered to discharge ESD current.

In a certain embodiment, an exemplary ESD protection structure can include an RC delay (or RC coupling circuit), three inverters, a parasitic diode, two parasitic PNP bipolar transistors, and one parasitic NPN bipolar transistor. The RC delay and the first invert are located in a power cell (e.g., including a power supply), while the second inverter, the parasitic diode and the bipolar transistors are located in the I/O cell. The disclosed layout is an example for the ESD PMOS in an I/O cell with its N-well and N+ guard ring, the PMOS device is laid out such that the left and right outside are both source, and then with alternated source and drain on the active area. The source of the PMOS is connected with Vdd power and the drain is connected with I/O pad (or I/O interface terminal). Thus, the parasitic diode is formed between the I/O pad and the Vdd power.

In this manner, an N+ diffusion area with a small area is added adjacent to the PMOS active area to form the base region of the first parasitic PNP, the collector is formed by the source of PMOS (of which is connected to Vdd) and the emitter is connected with Vss ground through an resistor of a P-sub. The second PNP is formed with the same base and emitter but with the drain of the PMOS as its collector, which is connected to the I/O pad.

The NPN scheme and layout is described as follows. Firstly, a third inverter is added to produce the trigger voltage of the NPN. The ESD NMOS layout is similar to the ESD PMOS, except that the diffusion type is in an opposite fashion. A small area of P+ diffusion area, adjacent to the NMOS active area, can be included to form the base (or base region) of the parasitic NPN. The collector of the parasitic NPN can be formed by the source of the NMOS, which is connected to the I/O pad. The emitter of the parasitic NPN can be formed by the drain of the NMOS, which is connected to Vss ground terminal.

In a certain ESD protection circuit, as shown in FIG. 5, when an ESD pulse is applied on Vdd power, point a can be on state '0' since RC delay is much larger than ESD rise up speed, which leads to state '1' on point b and state '0' on point c. The base of the PNP1 can have low voltage, resulting in the turn-on of the bipolar. This can conduct extra current from Vdd power to VSS ground.

Since the ESD protection structure is used in all I/O cells, there can be about tens of I/Os on the I/O power ring of Vdd, each discharging current from Vdd to Vss, which is helpful for protecting the Vdd power of the chip/wafer. The PNP2 is also turned on and discharges current from I/O pad to Vss, which forms an additional ESD path.

The disclosed ESD protection structure is a 'local' protection which is contained in each I/O cell rather than a remote protection from the power cells. When an ESD pulse is applied on Vdd power, a state '1' is produced at point d, which is the base of the NPN. Thus, the NPN device is turned on to conduct current from I/O pad to the Vss ground, providing extra current discharge path. This path can facilitate the ESD protection of the I/O pad.

In a certain embodiment, an ESD protection structure can include an RC triggering structure configured between a pair of power rails. A PNP bipolar can be triggered by the RC triggering device during an ESD event. When activated, the PNP bipolar can act as a discharge path of the power rails. Another PNP bipolar can be triggered by the RC triggering device during an ESD event. When activated, this PNP bipolar can act as a discharge path from I/O pad to Vss. An NPN bipolar can also be triggered by the RC triggering device during an ESD event. When activated, the NPN bipolar can act as a discharge path from I/O pad to Vss.

The base of the PNP bipolar can include an N+ diffusion area added between ESD PMOS in the layout. A collector of the PNP bipolar can include a drain diffusion area of the PMOS. An emitter of the PNP bipolar can include the P-substrate which is connected to Vss. The base of the NPN bipolar can include a P+ diffusion area added between ESD NMOS in the layout; a collector of the NPN bipolar can include a drain diffusion area of the NMOS; and the emitter of the NPN bipolar can include a source of the NMOS, which is connected to Vss.

Other applications, advantages, alternations, modifications, or equivalents to the disclosed embodiments are obvious to those skilled in the art.

What is claimed is:

1. An electrostatic discharge (ESD) protection structure comprising:
    a semiconductor substrate including a first N-type well region and a first P-type well region, the first N-type well region including a first region and a second region, and the first P-type well region including a third region and a fourth region;
    a PMOS transistor located in the first region of the first N-type well region, the PMOS transistor including a gate located on the first N-type well region, and a source region and a drain region respectively located on both sides of the gate in the first N-type well region, the source region and the gate of the PMOS transistor being connected to a power supply terminal, and the drain region of the PMOS transistor being connected to an input and output (I/O) interface terminal;
    a first doped base region located in the second region of the first N-type well region, wherein the first doped base region is N-type doped and connected to an external trigger-voltage adjustment circuit, and wherein the external trigger-voltage adjustment circuit is configured to pull down an electric potential of the first doped base region when the power supply terminal generates an instantaneous electric potential difference;
    an NMOS transistor located in the third region of the first P-type well region, the NMOS transistor including a gate located on the first P-type well region, and a source region and a drain region respectively located on both sides of the gate in the first P-type well region, the drain region of the NMOS transistor being connected to the I/O interface terminal, and the gate and the source region of the NMOS transistor being connected to a ground terminal; and
    a second doped base region located in the fourth region of the first P-type well region, wherein the second doped base region is P-type doped and is connected to the external trigger-voltage adjustment circuit, and wherein the external trigger-voltage adjustment circuit is configured to pull up an electric potential of the second doped base region when the power supply terminal generates the instantaneous electric potential difference.

2. The structure according to claim 1, wherein:
    the first doped base region, the source region of the PMOS transistor, and the semiconductor substrate, form a first PNP-type parasitic transistor,
    the first doped base region, the drain region of the PMOS transistor, and the semiconductor substrate form a second PNP-type parasitic transistor, and
    the second doped base region, the drain region of the NMOS transistor, and the source region of the NMOS transistor, form a first NPN-type parasitic transistor.

3. The structure according to claim 1, wherein:
    the external trigger-voltage adjustment circuit includes an RC (resistor-capacitor) coupling circuit and an inverter circuit,
    the RC coupling circuit includes a coupling capacitor and a coupling resistor configured in series at one terminal of each of the coupling capacitor and the coupling resistor, another terminal of the coupling resistor being connected to the power supply terminal, another terminal of the coupling capacitor being connected to the ground terminal, and an RC coupling node being connected to the inverter circuit, and
    the inverter circuit includes a first inverter, a second inverter and a third inverter that are configured in series, an input terminal of the first inverter being connected to the RC coupling node, an output terminal of the first inverter being connected to an input terminal of the second inverter, an output terminal of the second inverter being connected to an input terminal of the third inverter and the first doped base region, and an output terminal of the third inverter being connected to the second doped base region.

4. The structure according to claim 1, wherein:
    the first N-type well region further includes a first N-region, the first N-region surrounding the PMOS transistor and the first doped base region, and the first N-region being connected to the power supply terminal.

5. The structure according to claim 1, wherein:
    the first P-type well region further includes a first P-region, the first P-region surrounding the NMOS transistor and the second doped base region, and the first P-region being connected to the ground terminal.

6. The structure according to claim 1, wherein the PMOS transistor includes common-source/drain PMOS transistors, the common-source/drain PMOS transistors including: first source regions and first drain regions that are alternately and spacedly distributed in the first N-type well region, and first gates that are respectively located between neighboring first source regions and first drain regions on the first N-type well region, the first gates and the first source regions being connected to the power supply terminal, the first drain regions being connected to the I/O interface terminal, the first doped base region, the first source regions and the semiconductor substrate forming a plurality of first PNP-type parasitic transistors configured in parallel, and the first doped base region, the first drain regions, and the semiconductor substrate forming a plurality of second PNP-type parasitic transistors configured in parallel.

7. The structure according to claim 1, wherein
    the NMOS transistor includes common-source/drain NMOS transistors, the common-source/drain NMOS transistors including second source regions and second drain regions that are alternately and spacedly distributed in the first P-type well region, and second gates that are respectively located between neighboring second source regions and second drain regions on the first P-type well region, the second source regions and second gates being connected to the ground terminal, the second drain regions being connected to the I/O interface terminal, and the second doped base region, the second source regions, and the second drain regions forming a plurality of first NPN-type parasitic transistors.

8. The structure according to claim 1, further including:
    a second N-type well region and a second P-type well region configured in the semiconductor substrate, the second N-type well region and the second P-type well region being located between the first N-type well region and the first P-type well region, and the first N-type well region, the second P-type well region, the second N-type well region, and the first P-type well region being sequentially and alternately distributed in the semiconductor substrate.

9. The structure according to claim 3, wherein:
each of the first inverter, the second inverter and the third inverter includes a CMOS inverter or a TTL inverter.

10. The structure according to claim 3, further including:
a switch-type NMOS transistor, a drain of the switch-type NMOS transistor being connected to the power supply terminal, a source of the switch-type NMOS transistor being connected to the ground terminal, and a gate of the switch-type NMOS transistor being connected to the output terminal of the first inverter.

11. The structure according to claim 6, wherein:
the second region is located in an extension direction of the first gates along which the first gates extend toward two ends,
the first doped base region is located in the second region, a length of the first doped base region along a distribution direction of the first source regions and the first drain regions equals to a distribution width of the first source regions and the first drain regions, and
the first doped base region has a width ranging from about 0.5 μm to about 5 μm.

12. The structure according to claim 11, wherein:
the first doped base region includes doped ions selected from phosphorus ions, arsenic ions, and antimony ions.

13. The structure according to claim 7, wherein:
the fourth region is located in an extension direction of the second gates along which the first gates extend toward two ends,
the second doped base region is located in the fourth region, a length of the second doped base region along a distribution direction of the second source regions and the second drain regions equals to a distribution width of the second source regions and the second drain regions, and
the second doped base region has a width ranging from about 0.5 μm to about 5 μm.

14. The structure according to claim 13, wherein:
the second doped base region includes doped ions selected from phosphorus ions, arsenic ions, and antimony ions.

15. The structure according to claim 8, further including:
a second P-region configured in the second P-type well region, the second P-region being connected to the ground terminal.

16. An electrostatic discharge (ESD) protection circuit comprising:
a PMOS transistor, having a source region and a gate connected to a power supply terminal, and a drain region connected to an I/O interface terminal;
an NMOS transistor, having a drain region connected to the I/O interface terminal, and a gate and a source region connected to a ground terminal;
a first PNP-type parasitic transistor, having an emitter region connected to the power supply terminal, a collector region connected to the ground terminal, and a base region connected to an external trigger-voltage adjustment circuit, wherein the external trigger-voltage adjustment circuit pulls down an electric potential of the base region of the first PNP-type parasitic transistor when the power supply terminal generates an instantaneous electric potential difference;
a second PNP-type parasitic transistor, having an emitter region connected to the I/O interface terminal, a collector region connected to the ground terminal, and a base region connected to the external trigger-voltage adjustment circuit, wherein the external trigger-voltage adjustment circuit pulls down an electric potential of the base region of the second PNP-type parasitic transistor when the power supply terminal generates an instantaneous electric potential difference; and
a first NPN-type parasitic transistor, having an emitter region connected to the ground terminal, a collector region connected to the I/O interface terminal, and a base region connected to the external trigger-voltage adjustment circuit, wherein the external trigger-voltage adjustment circuit pulls up an electric potential of the base region of the first NPN-type parasitic transistor when the power supply terminal generates an instantaneous electric potential difference.

17. The circuit according to claim 16, wherein:
the external trigger-voltage adjustment circuit includes an RC (resistor-capacitor) coupling circuit and an inverter circuit,
the RC coupling circuit includes a coupling capacitor and a coupling resistor configured in series at one terminal of each of the coupling capacitor and the coupling resistor, another terminal of the coupling resistor being connected to the power supply terminal, another terminal of the coupling capacitor being connected to the ground terminal, and an RC coupling node being connected to the inverter circuit, and
the inverter circuit includes a first inverter, a second inverter and a third inverter that are configured in series, an input terminal of the first inverter being connected to the RC coupling node, an output terminal of the first inverter being connected to an input terminal of the second inverter, an output terminal of the second inverter being connected to an input terminal of the third inverter, the base region of the first PNP-type parasitic transistor, and the base region of the second PNP-type parasitic transistor, an output terminal of the third inverter being connected to the base regions of the first NPN-type parasitic transistor.

18. The circuit according to claim 16, wherein:
the first PNP-type parasitic transistor includes a plurality of first PNP-type parasitic transistors configured in parallel,
the second PNP-type parasitic transistor includes a plurality of second PNP-type parasitic transistors configured in parallel, and
the first NPN-type parasitic transistor includes a plurality of first NPN-type parasitic transistors configured in parallel.

* * * * *